(12) United States Patent
Dummer

(10) Patent No.: US 12,166,333 B2
(45) Date of Patent: Dec. 10, 2024

(54) SMALL PITCH VCSEL ARRAY

(71) Applicant: VIXAR, INC., Plymouth, MN (US)

(72) Inventor: Matthew M. Dummer, Minneapolis, MN (US)

(73) Assignee: VIXAR, INC., Plymouth, MN (US)

( * ) Notice: Subject to any disclaimer, the term of this patent is extended or adjusted under 35 U.S.C. 154(b) by 0 days.

(21) Appl. No.: 16/676,376

(22) Filed: Nov. 6, 2019

(65) Prior Publication Data

US 2020/0144792 A1     May 7, 2020

Related U.S. Application Data

(60) Provisional application No. 62/756,128, filed on Nov. 6, 2018.

(51) Int. Cl.
    *H01S 5/183*         (2006.01)
    *H01S 5/042*         (2006.01)
    *H01S 5/42*           (2006.01)

(52) U.S. Cl.
CPC ...... *H01S 5/18344* (2013.01); *H01S 5/04254* (2019.08); *H01S 5/18311* (2013.01); *H01S 5/423* (2013.01)

(58) Field of Classification Search
None
See application file for complete search history.

(56) References Cited

U.S. PATENT DOCUMENTS

| | | | |
|---|---|---|---|
| RE41,738 E | | 9/2010 | Brenner et al. |
| 8,040,934 B2 * | 10/2011 | Masui | H01S 5/18344 372/29.013 |
| 8,249,121 B2 | 8/2012 | Brenner et al. | |
| 8,494,018 B2 | 7/2013 | Brenner et al. | |
| 8,660,161 B2 | 2/2014 | Brenner et al. | |
| 8,989,230 B2 | 3/2015 | Dummer et al. | |
| 9,088,134 B2 | 6/2015 | Hibbs-Brenner et al. | |
| 9,742,153 B1 | 8/2017 | Barve et al. | |
| 10,205,303 B1 * | 2/2019 | Hegblom | H01S 5/04254 |
| 10,581,225 B1 * | 3/2020 | Su | H01S 5/0234 |
| 10,833,479 B2 * | 11/2020 | Oki | H01S 5/04252 |
| 11,831,129 B2 * | 11/2023 | Barve | H01S 5/423 |
| 11,894,659 B2 * | 2/2024 | Yoon | H01S 5/423 |

(Continued)

FOREIGN PATENT DOCUMENTS

| | | |
|---|---|---|
| EP | 1104056 A1 | 5/2001 |
| JP | 2008-47717 A | 2/2008 |
| JP | 2010212385 A | 9/2010 |

OTHER PUBLICATIONS

International Search Report for corresponding International Application No. PCT/US2019/060154, mailed Apr. 9, 2020, 3 pages.

(Continued)

*Primary Examiner* — Tod T Van Roy
(74) *Attorney, Agent, or Firm* — Viering, Jentschura & Partner mbB; Robert M Bilotta, Jr.

(57) ABSTRACT

Vertical-cavity surface-emitting lasers (VCSELs) and VCSEL arrays having small size and small pitch are provided. Particularly, the present disclosure relates to novel and advantageous chip layouts for ensuring low resistance devices with good yield for small pitch arrays. More particularly, the present disclosure describes approaches for reducing the area consumed by a VCSEL structure so that a higher density VCSEL device may be achieved.

13 Claims, 12 Drawing Sheets

(56) References Cited

U.S. PATENT DOCUMENTS

| | | | |
|---|---|---|---|
| 2003/0015726 A1* | 1/2003 | Iwai | H01S 5/1835 |
| | | | 257/178 |
| 2003/0206741 A1 | 11/2003 | Ledentsov et al. | |
| 2008/0205465 A1 | 8/2008 | Nguyen et al. | |
| 2008/0279241 A1 | 11/2008 | Oki et al. | |
| 2011/0176572 A1 | 7/2011 | Moser et al. | |
| 2012/0009704 A1* | 1/2012 | Masui | H01S 5/18344 |
| | | | 257/E33.072 |
| 2015/0222094 A1* | 8/2015 | Lee | H01S 5/423 |
| | | | 372/38.05 |
| 2015/0380901 A1 | 12/2015 | Brenner et al. | |
| 2017/0310086 A1* | 10/2017 | Barve | H01S 5/423 |
| 2019/0109436 A1* | 4/2019 | Hegblom | H01S 5/02345 |
| 2019/0305522 A1* | 10/2019 | Yuen | H01S 5/18311 |
| 2020/0313391 A1* | 10/2020 | Li | H01S 5/18341 |
| 2021/0305782 A1* | 9/2021 | Roucka | H01S 5/18313 |
| 2023/0216277 A1* | 7/2023 | Uchida | H01S 5/18361 |
| | | | 356/4.01 |

OTHER PUBLICATIONS

Written Opinion for corresponding International Application No. PCT/US2019/060154, mailed Apr. 9, 2020, 6 pages.
International Preliminary Report on Patentability for PCT/US2019/060154; Mar. 2, 2021; 19 pages.
Supplementary Search Report issued for the corresponding European Application No. 19881894, dated Jul. 4, 2022, 2 pages (for informational purposes only).

* cited by examiner

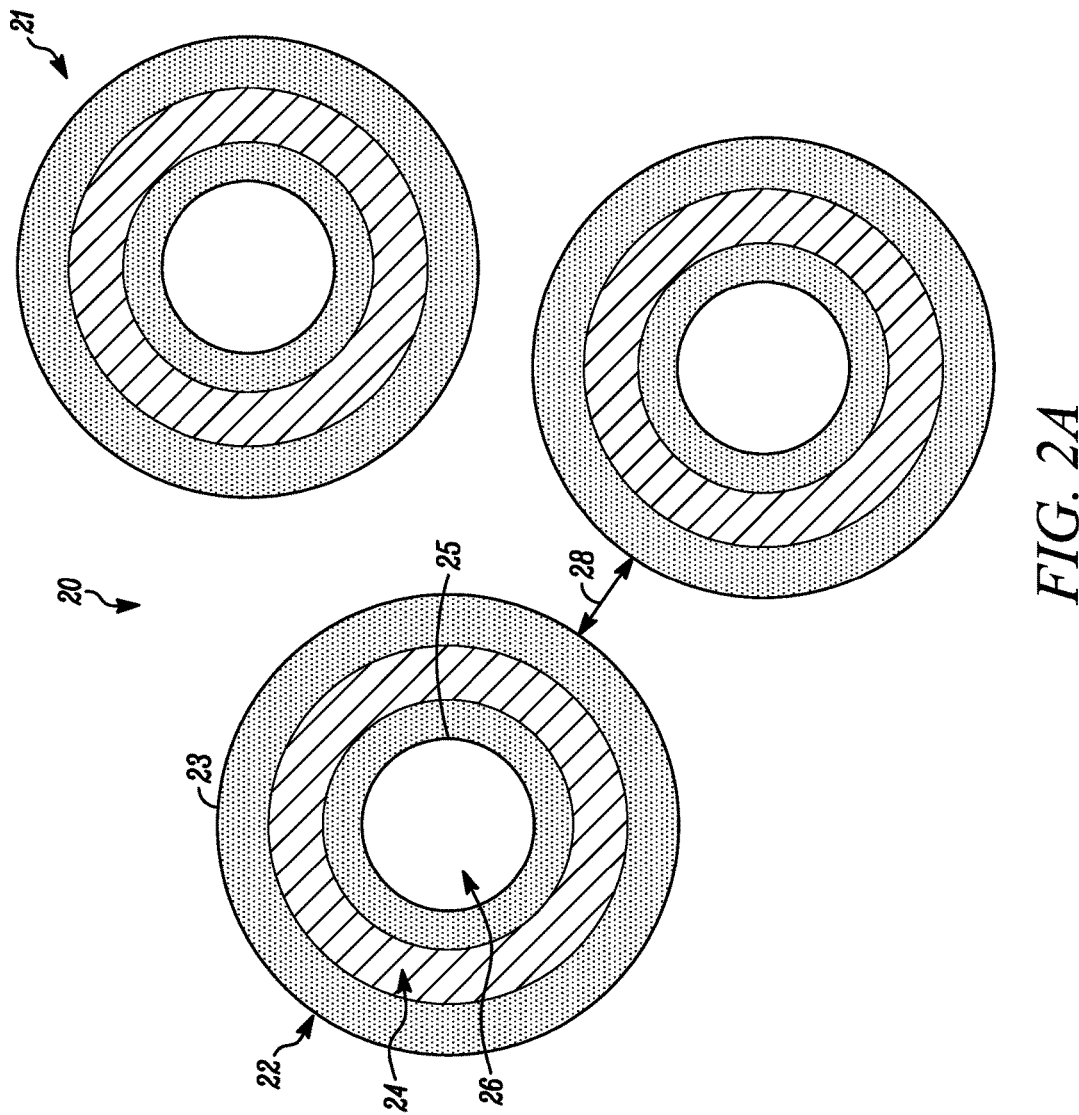

SMALL PITCH VCSEL ARRAY

CROSS-REFERENCE TO RELATED APPLICATION

The current application claims the benefit of U.S. Provisional Application No. 62/756,128, filed on 6 Nov. 2018, and which application is incorporated herein by reference.

FIELD OF THE INVENTION

The present disclosure relates to vertical-cavity surface-emitting lasers (VCSELs) and VCSEL arrays having a small pitch. Particularly, the present disclosure relates to novel and advantageous chip layouts for ensuring low resistance devices with good yield for small pitch VCSEL arrays.

BACKGROUND OF THE INVENTION

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

VCSELs and VCSEL arrays are important technology for applications within a variety of markets, including but not limited to, the consumer, industrial, automotive, and medical industries. Example applications include, but are not limited to, illumination for security cameras, illumination for sensors such as three-dimensional (3D) cameras or gesture recognition systems, medical imaging systems, light therapy systems, or medical sensing systems such as those requiring deep penetration into tissue. In such optical sensing and illumination applications as well as other applications, VCSELs and VCSEL arrays offer several benefits, as will be described in further detail herein, including but not limited to, power efficiency, narrow spectral width, narrow beam divergence, and significant packaging flexibility.

The amount of power emitted from a single VCSEL aperture can range from microwatts to tens of milliwatts, while VCSEL arrays are used to produce powers in the range of hundreds of milliwatts to watts, or even kilowatts. Higher power VCSEL arrays may be preferred for sensors operating over a longer distance, such as 3D sensors based upon Time of Flight or structured lighting approaches. Higher power VCSELs might also be required for deeper penetration into tissue for medical sensors or diagnostic devices, or therapeutic lasers. Higher power VCSELs could also be required for chemical or environmental sensors.

The design of a high power array has many aspects. These aspects include the design of the epitaxial layers and mask layout for achieving the best efficiencies, the size of the VCSEL aperture, and the arrangement and pitch of the VCSELs within an array. There are a couple of reasons why one might try to maximize the number of VCSELs in an array. One is to maximize the power or power density that can be provided from a VCSEL array. While increasing VCSEL aperture size may help with this, it soon reaches diminishing returns, as larger apertures become less efficient and more temperature sensitive. A second example is in the area of structured lighting, where additional spots can help to improve the resolution. Therefore, there is an interest in closer spacing of VCSEL devices in an array.

More specific details regarding VCSEL structure and fabrication as well as additional VCSEL embodiments and methods for making and using VCSELs are disclosed, for example, in: U.S. Pat. No. 8,249,121, titled "Push-Pull Modulated Coupled Vertical-Cavity Surface-Emitting Lasers and Method;" U.S. Pat. No. 8,494,018, titled "Direct Modulated Modified Vertical-Cavity Surface-Emitting Lasers and Method;" U.S. Pat. No. 8,660,161, titled "Push-Pull Modulated Coupled Vertical-Cavity Surface-Emitting Lasers and Method;" U.S. Pat. No. 8,989,230, titled "Method and Apparatus Including Movable-Mirror MEMS-Tuned Surface-Emitting Lasers;" U.S. Pat. No. 9,088,134, titled "Method and Apparatus Including Improved Vertical-Cavity Surface-Emitting Lasers;" U.S. Reissue Pat. No. RE41,738, titled "Red Light Laser;" and U.S. Publ. No. 2015/0380901, titled "Method and Apparatus Including Improved Vertical-Cavity Surface-Emitting Lasers;" of which the contents of each are hereby incorporated by reference herein in their entirety. Without being limited to solely the VCSELs described in any one of the foregoing patents or patent applications, VCSELs suitable for various embodiments of the present disclosure or suitably modifiable according to the present disclosure include the VCSELs disclosed in the foregoing patents or patent applications, including any discussion of prior art VCSELs therein, as well as VCSELs disclosed in any of the prior art references cited during examination of any of the foregoing patents or patent applications. More generally, unless specifically or expressly described otherwise, any VCSEL now known or later developed may be suitable for various embodiments of the present disclosure or suitably modifiable according to the present disclosure.

Additional information relating to VCSELs may also be found, for example, in U.S. Pat. No. 9,742,153, titled "Compact Emitter Design for a Vertical-Cavity Surface-Emitting Laser," which is also hereby incorporated by reference herein in its entirety.

Using VCSEL designs currently available, it is very difficult to have a small pitch because the minimum dimension needed for metal contacts and deeply etched mesas may be challenging with current photolithography and microelectronic process techniques. Accordingly, there is a need for vertical-cavity surface-emitting lasers (VCSELs) and VCSEL arrays having small size and small pitch that ensure low resistance devices with good yield.

BRIEF SUMMARY OF THE INVENTION

The following presents a simplified summary of one or more embodiments of the present disclosure in order to provide a basic understanding of such embodiments. This summary is not an extensive overview of all contemplated embodiments, and is intended to neither identify key or critical elements of all embodiments, nor delineate the scope of any or all embodiments.

The present disclosure, in one or more embodiments, relates to vertical-cavity surface-emitting lasers (VCSELs) and VCSEL arrays having small size and small pitch.

In one embodiment, a vertical-cavity surface-emitting laser (VCSEL) element is provided comprising an oxide aperture and a mesa concentrically surrounding the oxide aperture. The mesa may comprise a round mesa portion and a mesa tab, the mesa tab extending outwardly from the round mesa portion. Ohmic metal is provided on the mesa tab. A nitride via is etched on the mesa tab and extending towards the oxide aperture.

In another embodiment, a vertical-cavity surface-emitting laser (VCSEL) device is provided comprising an oxide aperture and a mesa concentrically surrounding the oxide aperture. The mesa may comprise a round mesa portion and a mesa tab, the mesa tab extending outwardly from the round mesa portion. Ohmic metal is provided on the mesa tab. A nitride via is etched on the mesa tab and extending towards the oxide aperture. A trench surrounds the round mesa portion at an oxidation distance. The mesa tab extends beyond the oxidation distance.

In yet another embodiment, a vertical-cavity surface-emitting laser (VCSEL) array is provided comprising a plurality of VCSEL elements. Each VCSEL element comprises an oxide aperture and a mesa concentrically surrounding the oxide aperture. The mesa may comprise a round mesa portion and a mesa tab, the mesa tab extending outwardly from the round mesa portion. Ohmic metal is provided on the mesa tab. A nitride via is etched on the mesa tab and extending towards the oxide aperture. In the array, adjacent VCSEL elements have overlapping mesa tabs.

While multiple embodiments are disclosed, still other embodiments of the present disclosure will become apparent to those skilled in the art from the following detailed description, which shows and describes illustrative embodiments of the invention. As will be realized, the various embodiments of the present disclosure are capable of modifications in various obvious aspects, all without departing from the spirit and scope of the present disclosure. Accordingly, the drawings and detailed description are to be regarded as illustrative in nature and not restrictive.

BRIEF DESCRIPTION OF THE DRAWINGS

While the specification concludes with claims particularly pointing out and distinctly claiming the subject matter that is regarded as forming the various embodiments of the present disclosure, it is believed that the invention will be better understood from the following description taken in conjunction with the accompanying Figures, in which:

FIG. 2a illustrates a top view of a conventional VCSEL array having a plurality of VCSEL apertures, in accordance with one embodiment.

DETAILED DESCRIPTION

The present disclosure relates to vertical-cavity surface-emitting lasers (VCSELs) and VCSEL arrays having small size and small pitch. Such VCSELs may be referred to as short oxide VCSELs. Particularly, the present disclosure relates to novel and advantageous chip layouts for ensuring low resistance devices with good yield for small pitch arrays. More particularly, the present disclosure describes approaches for reducing the area consumed by a VCSEL structure so that a higher density VCSEL device may be achieved.

Figure 1:
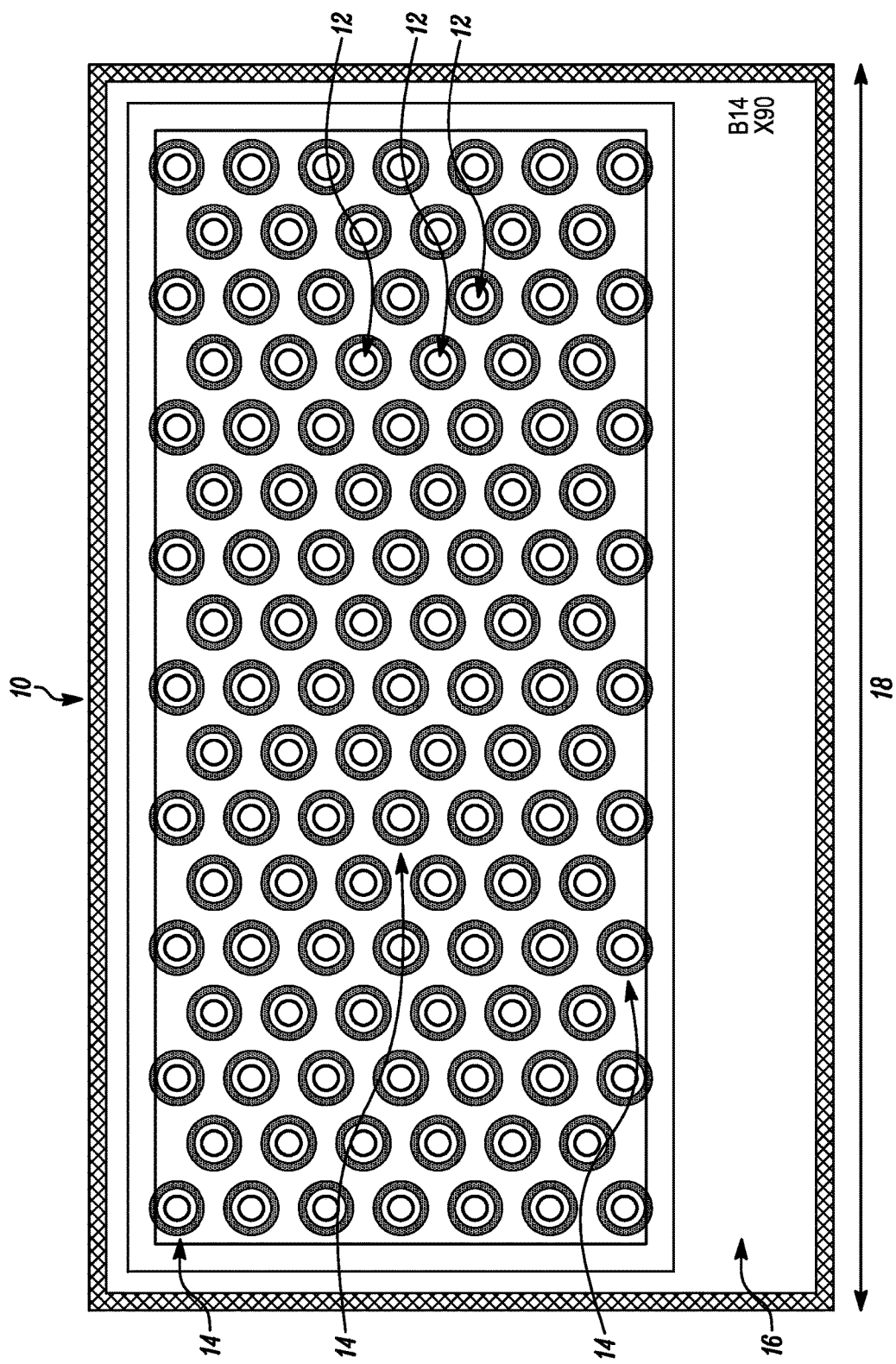
FIG. 1 illustrates a top view of conventional VCSEL die layout.

FIG. 1 illustrates a top view of conventional VCSEL die layout. The VCSEL die 10 comprises a plurality of VCSEL apertures 12 laid out in a VCSEL array with metal contact 14 surrounding the VCSEL apertures 12. In the embodiment shown, the VCSEL array comprises a hexagonal close-packed array of with 111 VCSEL apertures 12. The metal contact 14 may be provided by an interconnect metal that covers a majority of a surface of the chip, except for the apertures from which light is emitted. The interconnect metal may comprise any suitable metal that provides high conductivity, is easily patterned, and does not oxidize. For example, the interconnect metal may be gold or titanium gold. A metal bond pad 16 may be provided for wire bonding. The width 18 of the VCSEL die layout may be selected for the application. For example, the VCSEL die layout may have a width of about 1.5 mm.

The pitch of the VCSEL array is the distance from the center of one VCSEL aperture 12 to the center of another VCSEL aperture 12. A conventional VCSEL pitch is approximately 30-40 μm but may range down to approximately 20 μm with small VCSEL apertures (for example, a 5 μm VCSEL aperture). In general, it may be desirable to reduce the pitch of the VCSEL array without reducing the size of the VCSEL aperture. A VCSEL configuration and method for making such configuration is herein described.

Figure 2B:
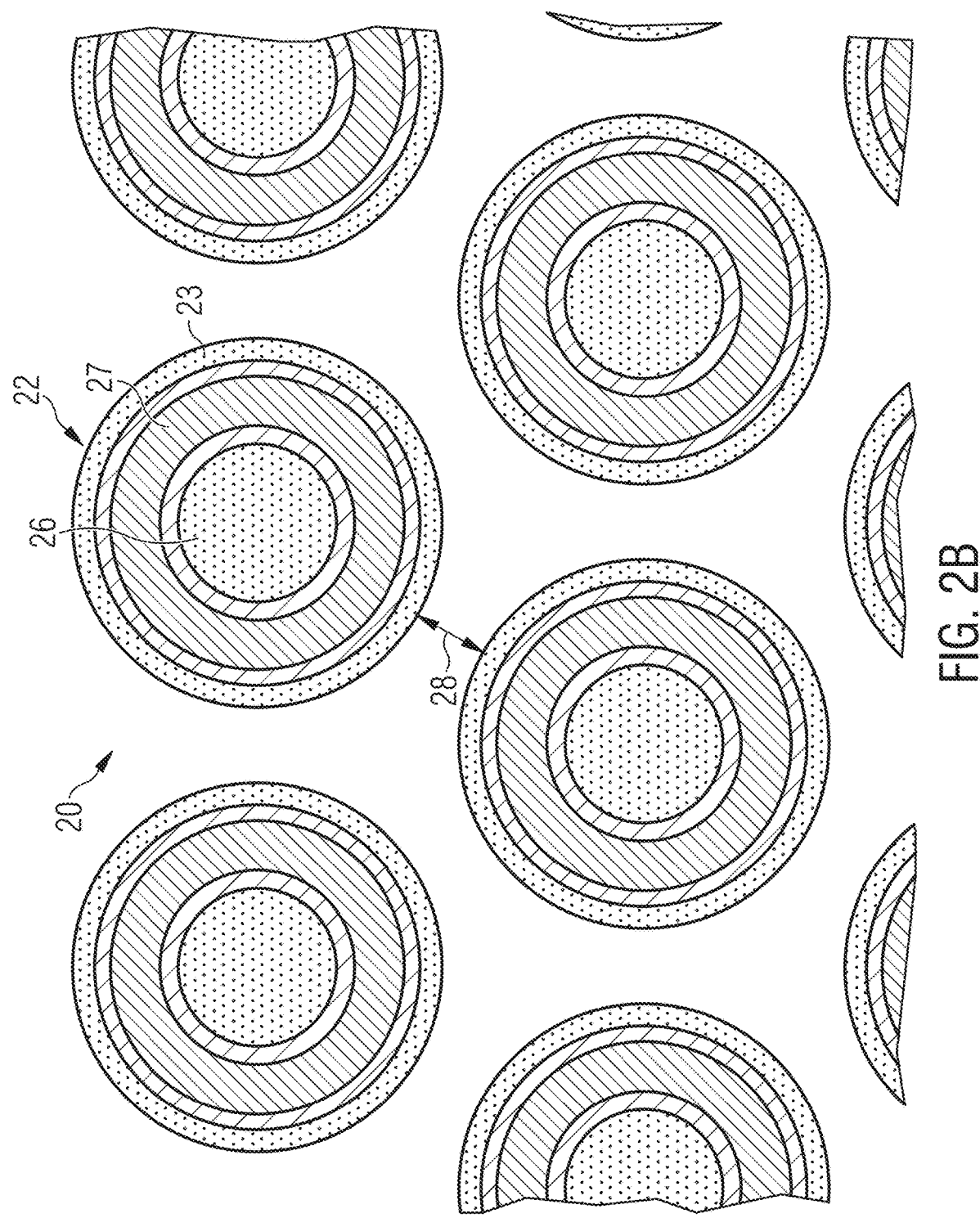
FIG. 2b illustrates a top partial view of a conventional VCSEL array having a plurality of VCSEL apertures, in accordance with one embodiment, where the broken or jagged lines indicate that the array extends beyond the illustrated section.

FIGS. 2a and 2b illustrate top views of conventional VCSEL array 20 having a plurality of VCSEL apertures. Each VCSEL 21 comprises a mesa 22. A ring of contact metal 24, also referred to as ohmic metal, is provided within the mesa 22 and surrounds an oxide aperture 26, also referred to as the VCSEL aperture. A nitride via ring 27 is provided entirely within the ohmic metal ring 24. The outer mesa edge is designated by 23. The space between each VCSEL may be trench 28. In general, the pitch between VCSEL emitters is limited by the size of the trench between VCSELs and the area on the top of the mesa needed for the ohmic contact metal and etched via to make an electrical interconnection to an active device.

As the desired pitch between VCSELs shrinks, the area available for making ohmic contact to the mesa 22 and for making contact between the ohmic metal 24 and the interconnect metal, described more fully below, shrinks. For instance, the ohmic metal 24 opening may be slightly smaller, equal to, or slightly larger than the oxide aperture 26. The outer edge of the ohmic metal 24 may be somewhat smaller than the mesa 22. This is to avoid any shorts developing between the ohmic and other layers exposed on the sidewall of the mesa 22 or bottom of the trench. In a VCSEL array having a 4 µm oxidation distance and a 1 µm offset of the ohmic metal 24 from both the oxide aperture 26 and the mesa edge 23, a 2 µm wide metal area remains. This provides only a tight alignment tolerance for aligning the interconnect metal to the ohmic metal.

Figure 3:
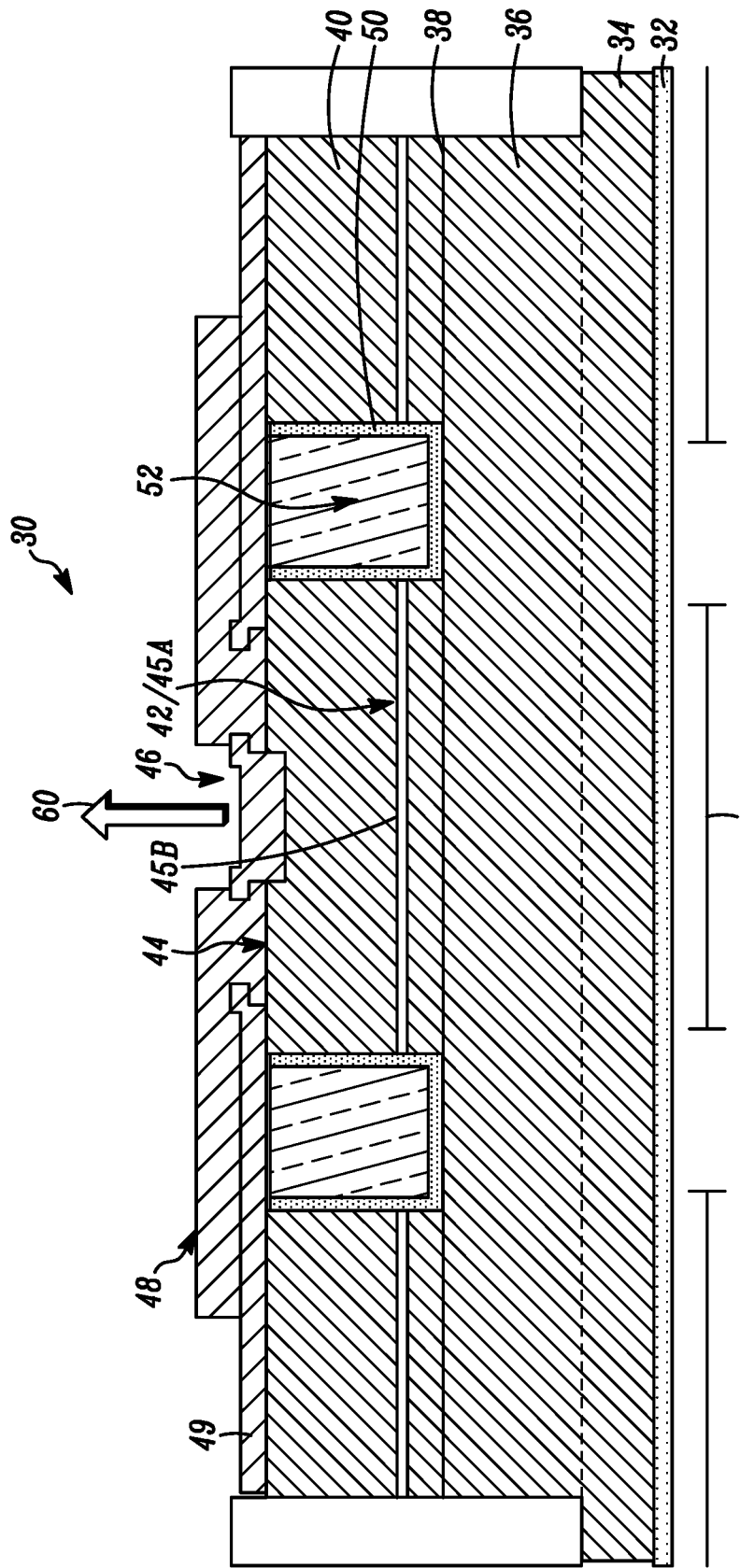
FIG. 3 illustrates a cross-section view of a conventional VCSEL device having multiple apertures.

FIG. 3 illustrates a cross sectional view of a VCSEL device 30 such as shown in top view in FIGS. 2a and 2b. The central region of the device of FIG. 3, shown at 21, reflects a single VCSEL 21, such as shown in FIGS. 2a and 2b. The fabricated VCSEL device includes a bottom metal contact 32, substrate 34, a bottom mirror 36, a quantum well active region 38, a top mirror 40, one or more oxide apertures 42, a contact metal 44, a dielectric cap 46, and an interconnect metal 48. A silicon nitride layer 49 may be provided. The substrate 34, bottom mirror 36, and top mirror 40 may together be referred to as a wafer. The VCSEL device further comprises trenches 50 filled with a planarization layer 52. The trenches separate VCSELs 21 from one another. The direction of emitted light is indicated at 60.

In general, the VCSEL 21 may comprise one or more mirrors, such as two mirrors 36 and 40, with a light generating quantum well active region 38 provided therebetween. Each of the mirrors may comprise a plurality of layers alternating compositions of different refractive indices. Each of these layers may be one or more epitaxial layers comprising a composition including aluminum. In one embodiment, each layer in the mirror is one quarter wavelength thick, or an odd number of quarter wavelength thick layers. For example, the mirrors 36, 40 may comprise alternating $Al_xGa_{(1-x)}As$ layers where the layers alternate between x=0.1 and x=0.85. In one embodiment, one mirror may be doped n-type and the other mirror may be doped p-type such that a p-n junction is located at the quantum well active layer 38 between the mirrors 34, 40.

Contact metal 44 is laid over a portion of the top mirror to form a base for the mesa of the VCSEL 21. For p-type GaAs, the contact metal may be, for example, Pt/Ti/Pt/Au.

In order to provide current confinement and electrical contact to the VCSEL 21, one of the epitaxial layers may be grown with a higher aluminum content ("the high aluminum content layer 45a, 45b") than the other layers. The high aluminum content layer 45a, 45b is indicated at the place of the oxide aperture 42 in the VCSEL array 20 of FIG. 3. A portion of the high aluminum content layer 45a is the precursor to the oxide aperture 42 and a portion of the high aluminum content layer 45b remains in the center of the oxide aperture 42. The length of the portion of the high aluminum content layer 45a that is oxidized is referred to as the oxidation distance. The oxidation distance is long enough to fit all of the features that are provided on the mesa as described with respect to FIGS. 2a and 2b. A typical target oxidation distance may be about 10 µm.

Trenches are etched around the oxide aperture 42 at the outside of the oxidation distance in a mesa configuration (referring to FIG. 2) to a depth that goes past the high aluminum content layer 45a, 45b. A typical depth may be about 3.5 µm. When the VCSEL device 30 is put in a steam atmosphere, the high aluminum content layer 45a is converted from AlGaAs to an oxide, which is insulating, to form the oxide aperture 42. By stopping the oxidation process at a distance which leaves the center of the VCSEL 21 unoxidized (represented 45b in FIG. 3), the middle of the VCSEL 21 is conducting, while an insulating aperture is formed by the converted oxide. The current flow is thus funneled through the formed aperture.

Returning now to FIGS. 2a and 2b, the trench 28 is where material may be etched away to provide access to the oxidation layer for the oxidation process. The largest circles denote the mesas 22 that remain after the etching process. Oxidation proceeds from this edge 23 and stops at the perimeter of the innermost circle 25, which is the VCSEL aperture 26. Within this innermost circle, oxidation has not occurred, whereas oxidation has occurred along the high aluminum content layer everywhere in the mesa outside of this circle 25. This provides current confinement of the VCSEL aperture 26 as the current flows between the top and the bottom of the VCSEL. Typically the mesa is covered by a dielectric layer. To make electric ohmic contact to the semiconductor, either the ohmic metal (the contact metal) is deposited first, followed by dielectric deposition, or a via may be etched through the dieletric so that the contact metal can be subsequently deposited and be in contact with the semiconductor. The ring 24 thus indicates the area where ohmic contact is made to the semiconductor. If the contact metal is deposited first, then the dielectric layer may be deposited and a via etched to allow a connection between the ohmic and the interconnect metals.

With reference to FIG. 3, when grown on a conducting substrate 34, one contact of the VCSEL array 20 may be made by depositing a uniform metal layer, bottom metal contact 32, such as an N-ohmic contact, on the bottom of the wafer. An ohmic metal contact 44, such as a P-ohmic contact, may be patterned on the top side of the wafer, leaving openings for light to be emitted, such as along and in the direction of path 60, corresponding to the non-oxidized portion of the high aluminum contact layer 45b. A planarization layer 52 may be deposited in the trenches 50 to re-planarize the surface. The planarization layer may comprise, for example a ceramic or a polymer dieletric. An interconnect metal 48 may be deposited and patterned over the planarization layer 52 and extending partially over the contact metal 44. The interconnect metal 48 should be in direct contact with the metal contact 44 with sufficient contact area to form a low resistance connection.

The VCSEL array 20 includes first and second contacts. The first contact comprises the contact metal 44 and the second contact comprises the substrate 34 and bottom metal contact 32.

One method of forming a VCSEL design is described above. This method may be modified to form slightly varied small pitch VCSEL designs. For example, in one embodiment a planarization layer may not be included and the interconnect metal may be deposited down diewalls of the mesas. In another modified method, the second contact may be formed by etching partially into the bottom mirror and depositing a second metal on top of the exposed bottom mirror.

VCSEL devices are fabricated on the order of tens of microns. Regardless of the method used to form the VCSEL device, the pitch of the VCSEL device depends on the trench width, the width of the mesa (and, more particularly, the width of the contact metal on the mesa), and the width of the via within the contact metal on the mesa. In general, a minimum trench width is greater than about 2 µm. This is because it is very difficult to etch a smaller trench using current technology and, even when such a width may be etched, the etch rate is generally slower and the trench will not etch to the desired depth to expose the underlying oxidation layer. Accordingly, it is impractical to reduce pitch by reducing trench width.

Thus, it may be desirable to reduce mesa size in order to reduce pitch size of a VCSEL array. One method of reducing mesa size is to reduce the size of the oxide aperture. However, there are many applications in which it is not desirable to reduce the size of the oxide aperture. Accordingly, it is not generally useful to reduce pitch size by reducing oxide aperture size.

The present disclosure teaches a VCSEL design having a smaller pitch without requiring a reduction in trench size or in oxide aperture size, by reducing an oxidation distance, or distance from the trench to the oxide aperture. In one embodiment, a concentric portion of the mesa is shrunk relative to typical mesa sizes and mesa tabs are added to support contact metal.

In order to reduce the VCSEL pitch, or the distance between centers of VCSEL apertures, all features, except the VCSEL aperture itself may be smaller than on a normal VCSEL array. The pitch is determined by the width of the trench etched between mesas, the VCSEL aperture, and the oxidation distance (times two). Thus, for example, if the desired pitch is 24 µm, the VCSEL aperture is 10 µm, and the trench between mesas is 2 µm, that leaves 12 µm, or 6 µm on each side, for an oxidation distance. If the desired pitch is 16 µm, that leaves 2 µm for an oxidation distance.

Figure 4B:
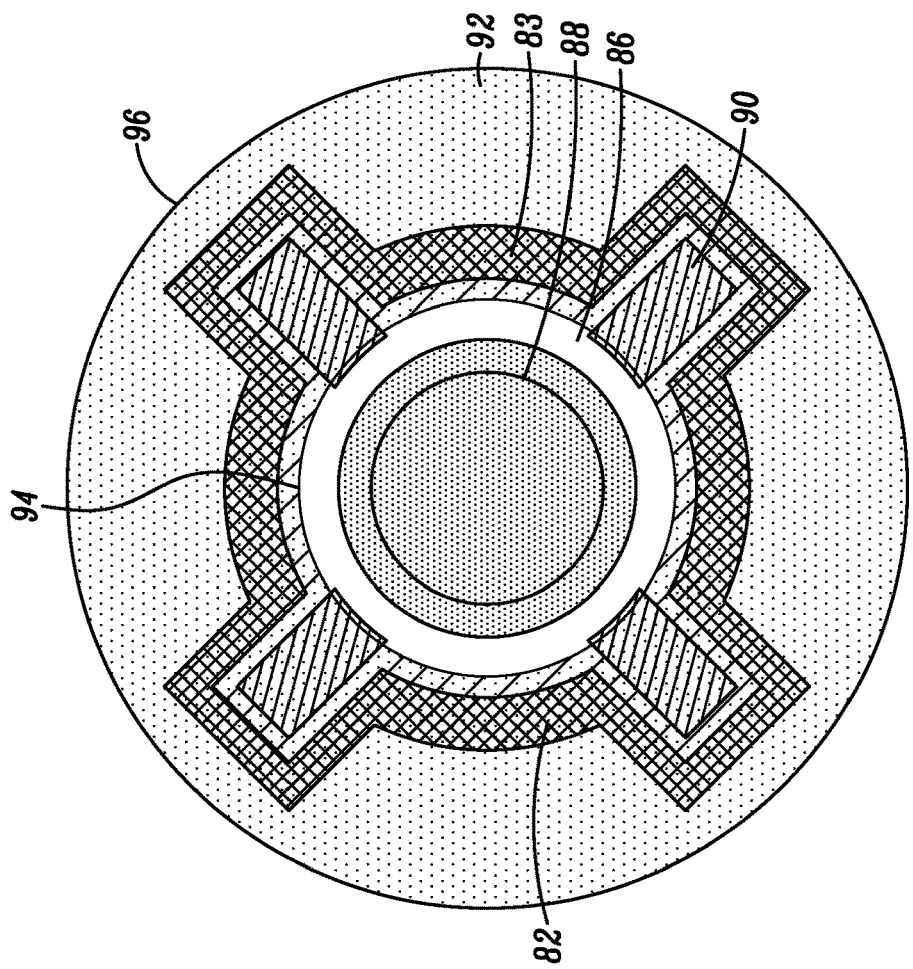
FIG. 4b illustrates interconnect metal with the VCSEL design of FIG. 4a, in accordance with one embodiment.
Figure 4A:
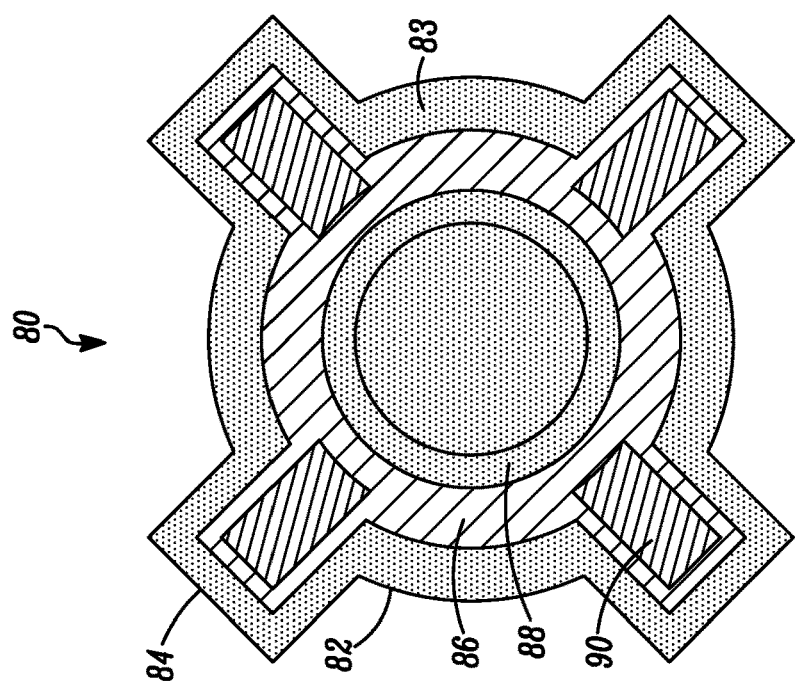
FIG. 4a illustrates a VCSEL mesa design that lessens the alignment tolerances required to achieve VCSEL fabrication with tight pitch, in accordance with one embodiment.

FIGS. 4a and 4b illustrate a tabbed VCSEL design, in accordance with one embodiment. FIG. 4a illustrates a VCSEL mesa design that lessens the alignment tolerances required to achieve VCSEL fabrication with tight pitch. FIG. 4b illustrates interconnect metal with the VCSEL design of FIG. 4a.

The VCSEL element 80 of FIG. 4a comprises a mesa 82, ohmic metal 86, an oxide aperture 88, and a nitride via 90. The mesa 82 comprises a round mesa portion 83 and mesa tabs 84, instead of a strictly circular or round mesa as shown and described with respect to FIG. 2. Ohmic metal 86 extends around the oxide aperture 88 and along the mesa tabs 84. A nitride via area 90 is provided generally central to the mesa tabs 84 where the via is made to access the ohmic metal.

In the embodiment shown, four mesa tabs 84 are provided with first and second tabs opposite one another and third and fourth tabs opposite one another and perpendicular to the first and second tabs. In alternative embodiments more or fewer tabs may be provided and the tabs may be provided in alternative configurations, for example as shown in FIGS. 6a-6e. In general, one mesa tab may be the minimum and more tabs may assist in uniformly distributing current. In some embodiments, the mesa tabs may be generally evenly distributed around the mesa round portion to avoid current crowding due to asymmetry.

When compared to a VCSEL device such as shown in FIG. 2, the mesa tabs of the embodiment of FIGS. 4a and 4b move the ohmic metal 86 onto a portion of the VCSEL device that normally comprises only the trench. This allows a reduction in the size of the round mesa portion. By reducing the round mesa portion, the pitch of a VCSEL array may be reduced.

FIG. 4b illustrates interconnect metal contacting the VCSEL element 80 of FIG. 4a. FIG. 4b illustrates interconnect metal 92, an interconnect metal inner edge 94, and an interconnect metal outer edge 96. A ring of interconnect metal 92 is deposited that has an inner diameter, formed by interconnect metal inner edge 94, that is larger than the VCSEL aperture/oxide aperture 88, but extends beyond the mesa 82. The interconnect metal covers most of the surface of the array VCSEL chip. At the area of the nitride via 90, the interconnect metal 90 makes contact with the ohmic metal 86.

Figure 5B:
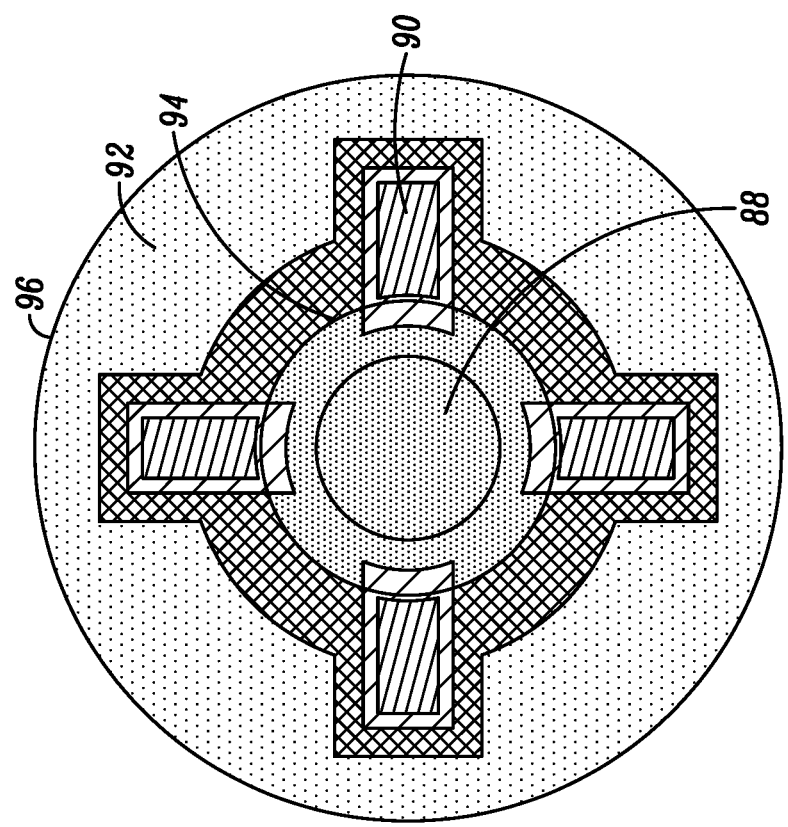
FIG. 5b illustrates interconnect metal with the VCSEL design of FIG. 5a, in accordance with one embodiment.
Figure 5A:
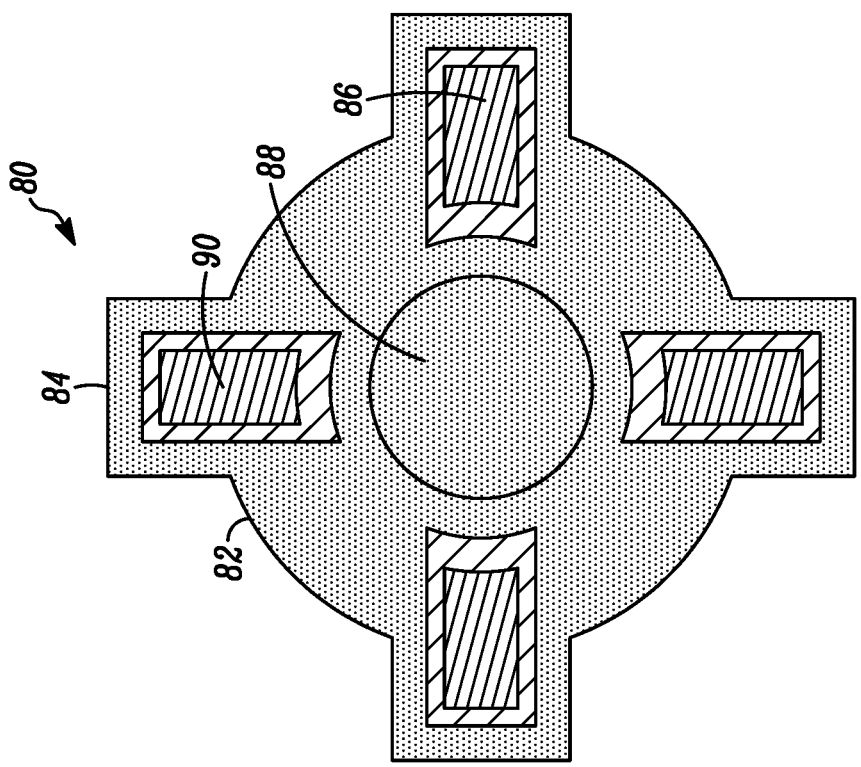
FIG. 5a illustrates a tabbed VCSEL design, in accordance with a further embodiment.

FIGS. 5a and 5b illustrate a tabbed VCSEL design, in accordance with a further embodiment. FIG. 5a illustrates a VCSEL mesa design that lessens the alignment tolerances required to achieve VCSEL fabrication with tight pitch without providing an ohmic ring. FIG. 5b illustrates interconnect metal with the VCSEL design of FIG. 5a. A primary difference between the embodiment of FIGS. 4a and 4b and the embodiment of FIGS. 5a and 5b is that ohmic metal on the embodiment of FIGS. 5a and 5b is provided only on the mesa tabs 84.

The VCSEL element 80 of FIG. 5a comprises a mesa 82, a mesa tab 84, ohmic metal 86, an oxide aperture 88, and a nitride via 90. The VCSEL element 80 has a mesa 82 comprising a round mesa portion and mesa tabs 84, instead of a strictly circular or round mesa. In the embodiment shown, four mesa tabs 84 are provided with first and second tabs opposite one another and third and fourth tabs opposite one another and perpendicular to the first and second tabs. In other embodiments, the first and second tabs may not be perpendicular to the third and fourth tabs. In alternative embodiments more or fewer tabs may be provided and the tabs may be provided in alternative configurations. Ohmic metal 86 extends along the mesa tabs 84 but is not provided around the oxide aperture 88. A nitride via area 90 is provided generally central to the mesa tabs 84 where the via is made in the nitride to access the ohmic metal. This approaches relies on lateral current spreading from the ohmic contact within the semiconductor layers at the top of the wafer.

FIG. 5b illustrates interconnect metal contacting the VCSEL element 80 of FIG. 5a. FIG. 5b illustrates interconnect metal 92, an interconnect metal inner edge 94, and an interconnect metal outer edge 96. A ring of interconnect metal 92 is deposited that has an inner diameter, formed by interconnect metal inner edge 94, that is larger than the VCSEL aperture/oxide aperture 88 and permits a portion of the ohmic metal 86 disposed on the mesa tabs 84 to be uncovered, but extends beyond the mesa 82. The interconnect metal covers most of the surface of the array VCSEL chip. At the area of the nitride via 90, the interconnect metal 90 makes contact with the ohmic metal 86.

In each of the embodiments of FIGS. 4a and 4b and of FIGS. 5a and 5b, no isolation layer is required. In conventional VCSEL arrays, trenches are etched to allow the oxidation layers to be accessed. However, VCSEL apertures are connected to each other through the semiconductor layers, and so an isolation implant is required to isolate the VCSELs from each other and prevent leakage of current through areas that do not lase. In the approach described herein, the mesas are fully separated from one another by etching the layers, and hence an isolation implant is not required. The area around the VCSEL aperture and the mesa tabs may be provided with an oxide layer completely oxidized in order to prevent current leakage into the substrate. Accordingly, the width of the mesa tabs may be less than about two times the oxidation distance. For example, with a 6 µm VCSEL aperture and a 4 µm oxidation distance, the tab width may be approximately 6 µm, or may range from approximately 3 µm to approximately 8 µm. The ohmic contact may be about 2 µm narrower, or 4 µm, and the nitride via may thus be approximately 3 µm wide.

Figure 6B:
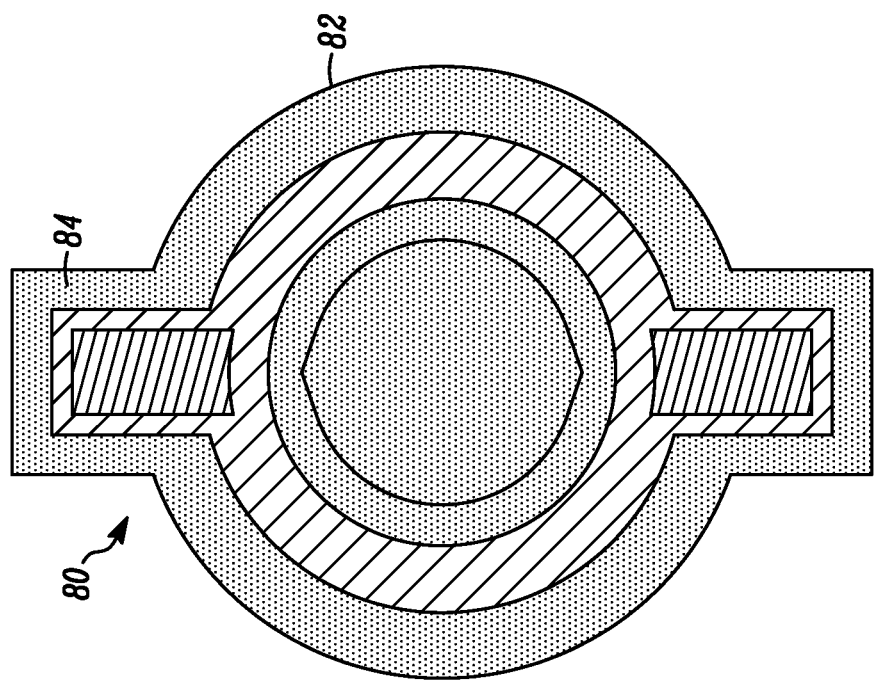
FIG. 6b illustrates a VCSEL element having a mesa having two mesa tabs, in accordance with one embodiment.
Figure 6A:
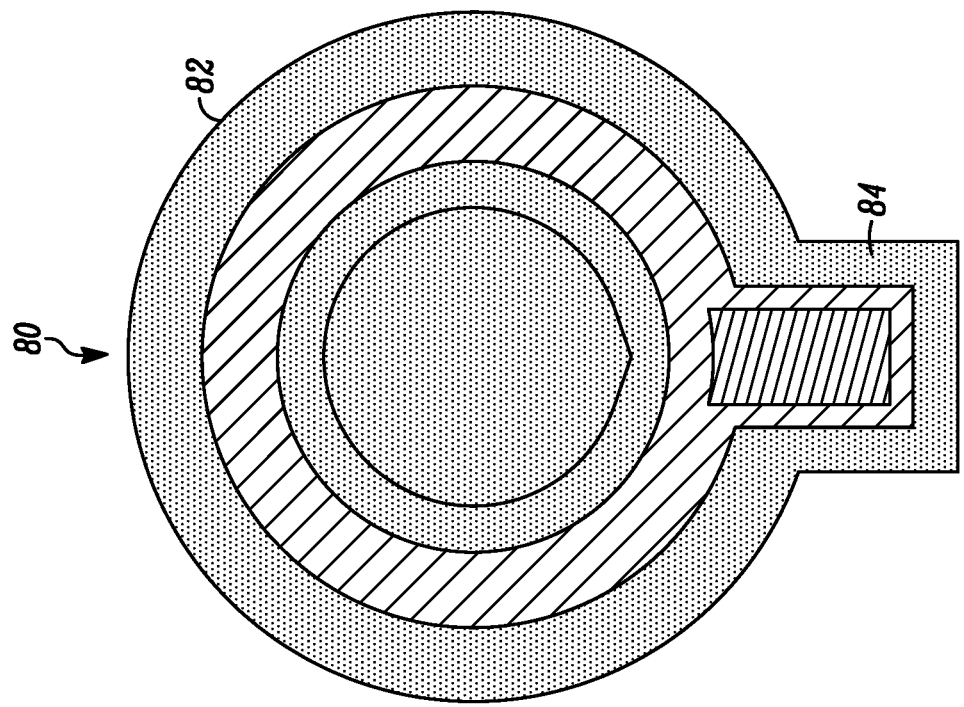
FIG. 6a illustrates a VCSEL element having a mesa having one mesa tab, in accordance with one embodiment.
Figure 6D:
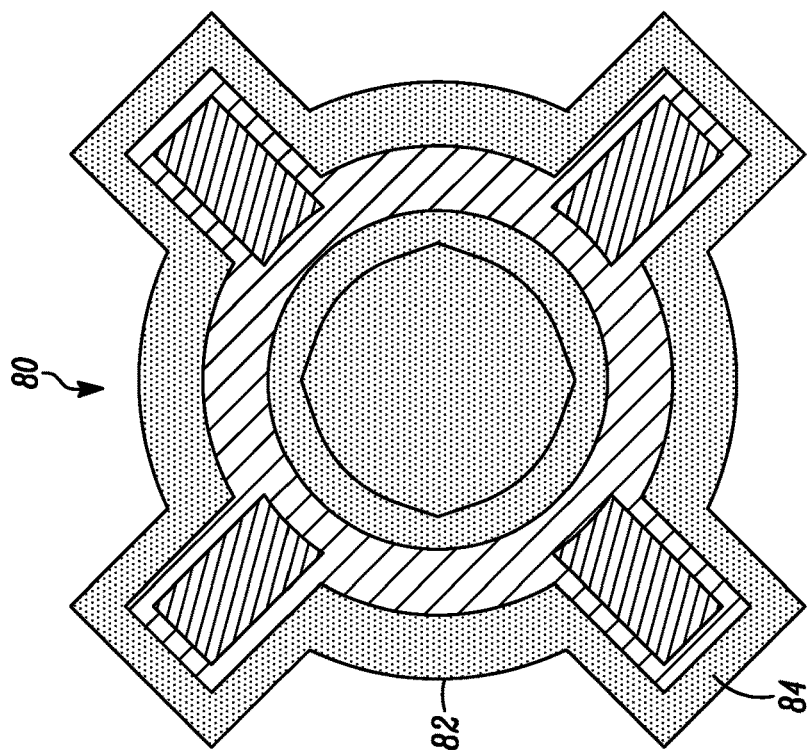
FIG. 6d illustrates a VCSEL element having a mesa having four mesa tabs, in accordance with one embodiment.
Figure 6C:
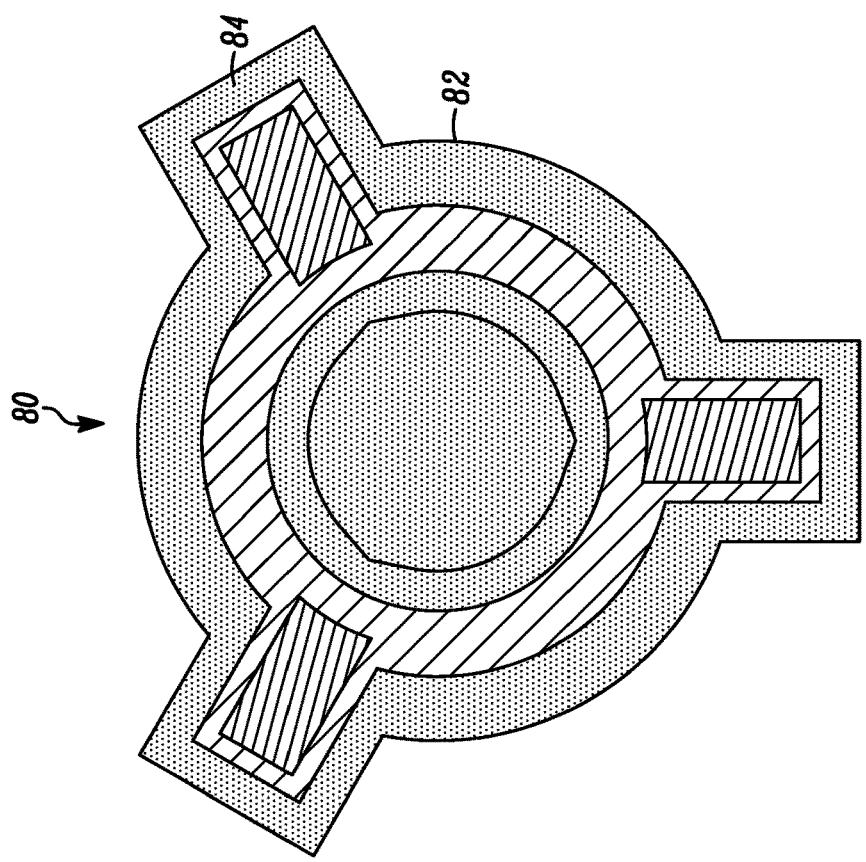
FIG. 6c illustrates a VCSEL element having a mesa having three mesa tabs, in accordance with one embodiment.
Figure 6E:
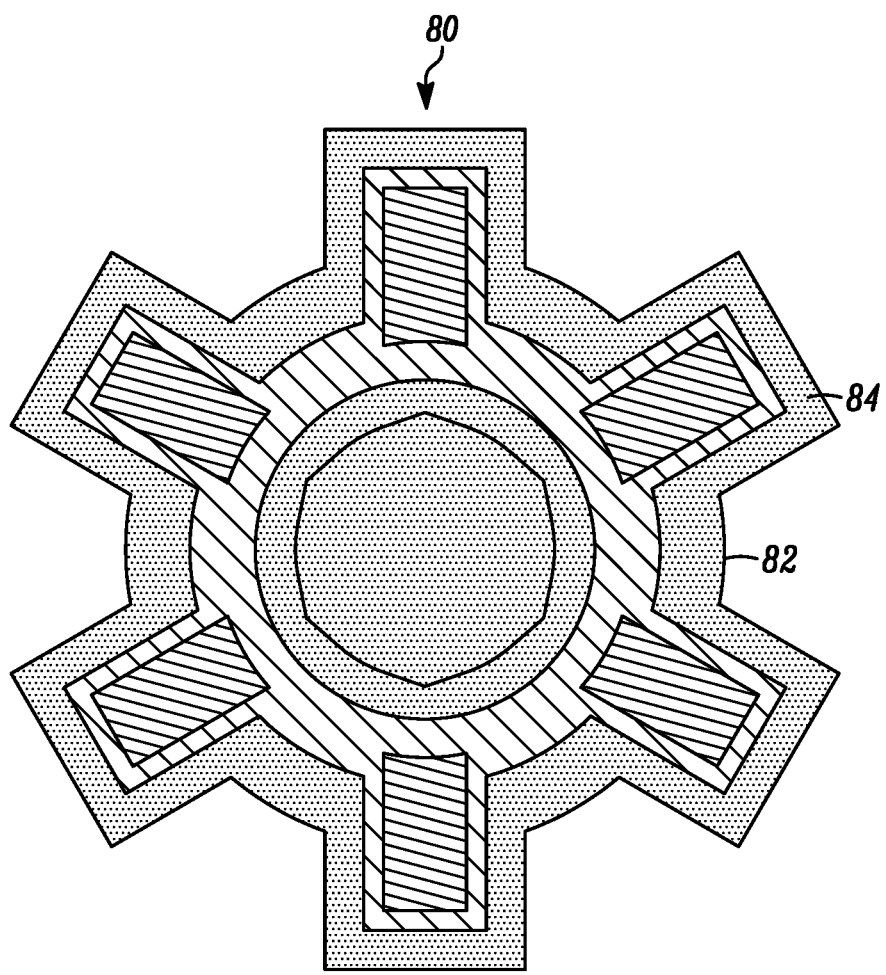
FIG. 6e illustrates a VCSEL element having a mesa having five mesa tabs, in accordance with one embodiment.

As previously described, the VCSEL elements 80 may be provided with any suitable number of mesa tabs 84. FIG. 6a illustrates a VCSEL element 80 having a mesa 82 having one mesa tab 84, in accordance with one embodiment. FIG. 6b illustrates a VCSEL element 80 having a mesa 82 having two mesa tabs 84, in accordance with one embodiment. FIG. 6c illustrates a VCSEL element 80 having a mesa 82 having three mesa tabs 84, in accordance with one embodiment. FIG. 6d illustrates a VCSEL element 80 having a mesa 82 having four mesa tabs 84, in accordance with one embodiment. FIG. 6e illustrates a VCSEL element 80 having a mesa 82 having five mesa tabs 84, in accordance with one embodiment.

Figure 7A:
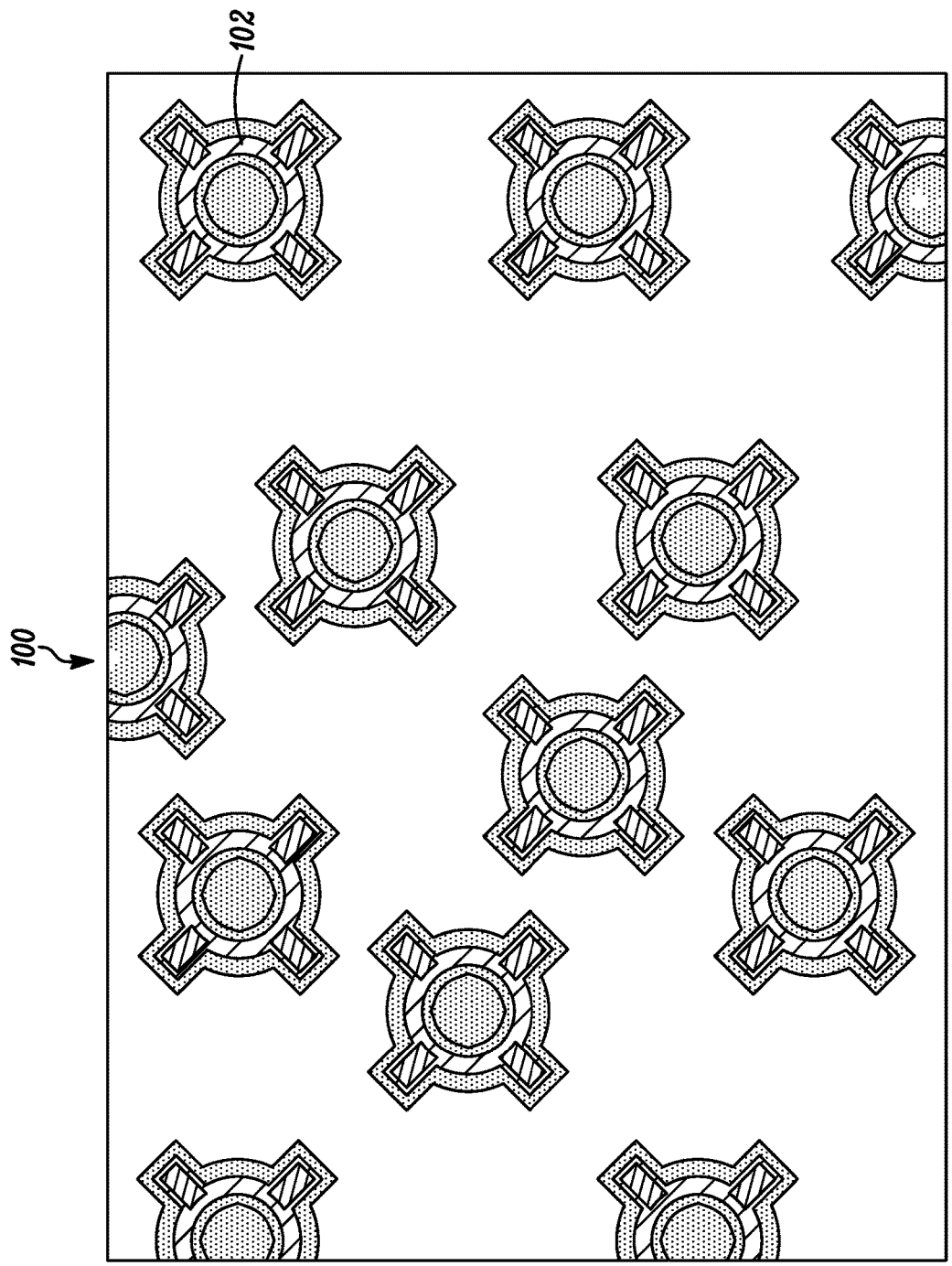
FIG. 7a illustrates a VCSEL array configuration having non-regular spacing, in accordance with one embodiment.
Figure 7B:
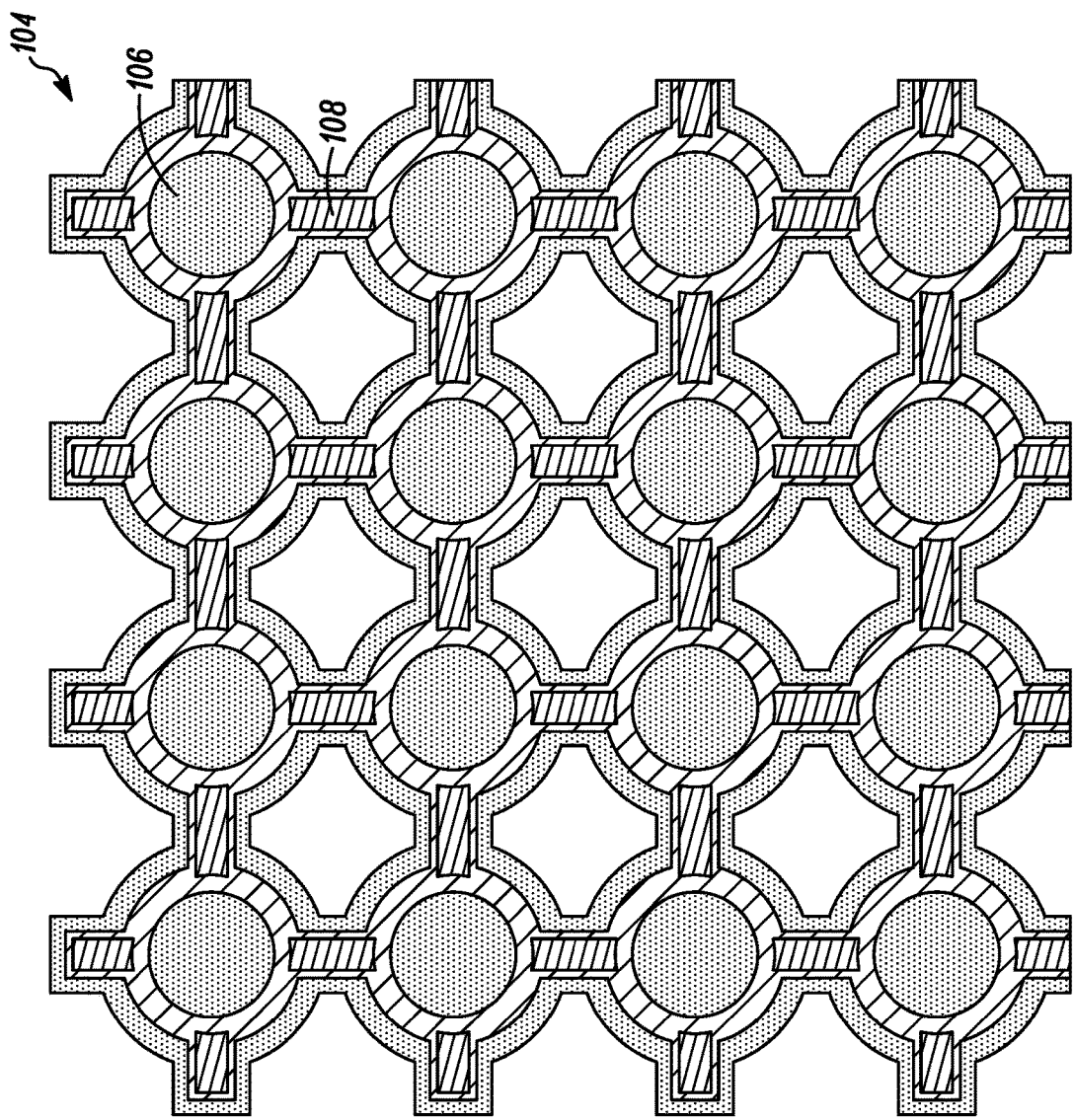
FIG. 7b illustrates a VCSEL array configuration having square packing, in accordance with one embodiment.
Figure 7C:
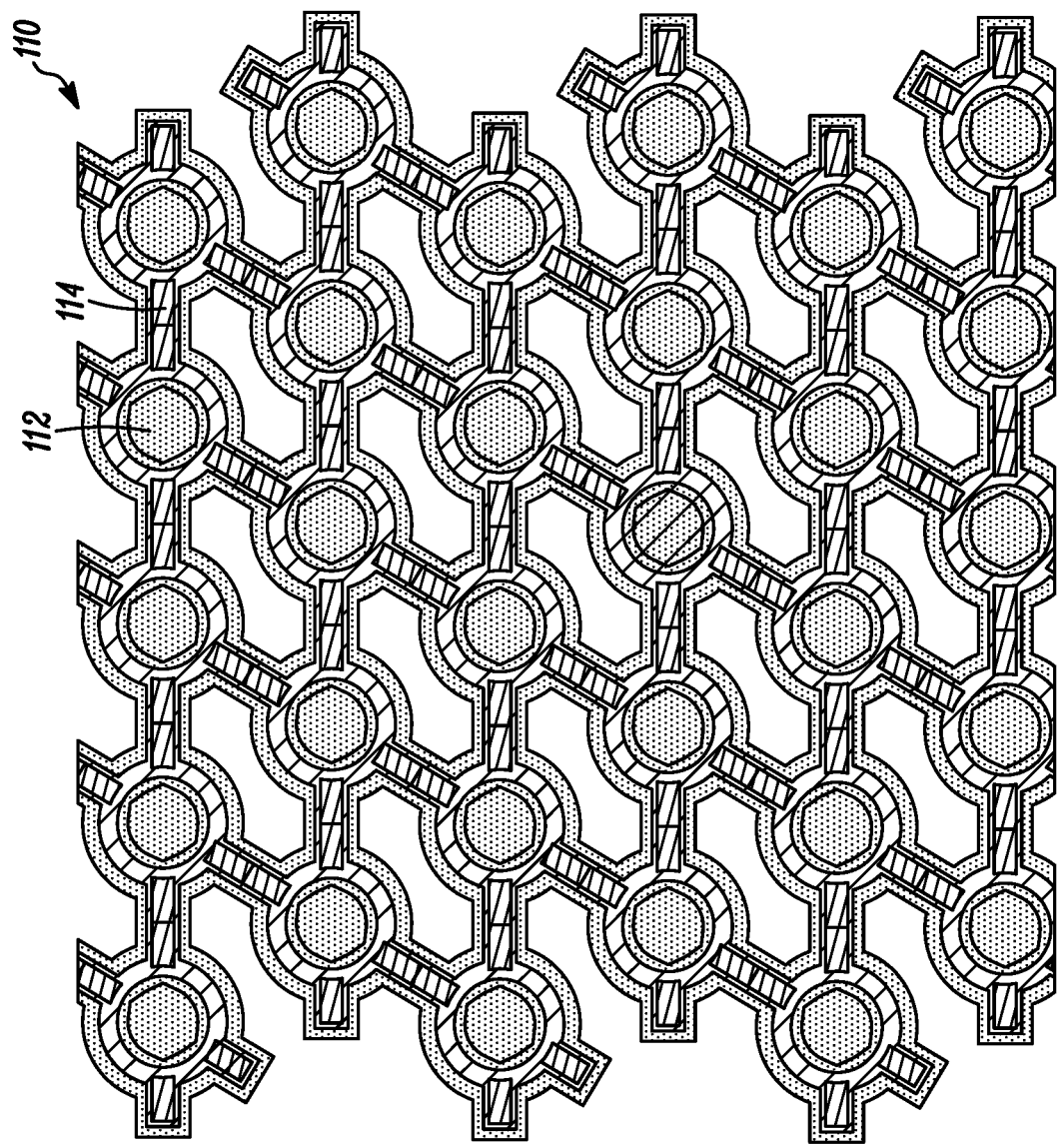
FIG. 7c illustrates a VCSEL array configuration having hexagonal packing, in accordance with one embodiment.

FIGS. 7a-7c illustrate VCSEL elements having mesa tabs incorporated into VCSEL arrays, in accordance with various embodiments. Many other arrangements can be envisioned or considered based on the teachings of the present disclosure.

FIG. 7a illustrates a VCSEL array configuration having non-regular spacing. This is a pseudo-random array 100 wherein the mesas of the VCSEL elements 102 are fully separated from one another. This may be suitable for an array having 20 µm pitch, for example. For VCSEL arrays in which the mesas are completely separated, the array may be subdivided into smaller arrays sharing an interconnect metal contact, or providing individually addressable VCSELs.

FIG. 7b illustrates a VCSEL array configuration having square packing. The square array 104 is formed with the mesa of each VCSEL element 106 having four tabs 108 and arranged in such a way that tabs 108 of adjacent VCSEL elements 106 overlap. This may be suitable for an array having 16 µm pitch, for example.

FIG. 7c illustrates a VCSEL array configuration having hexagonal packing. The array 110 is a hexagonal close-packaged array with four overlapping tabs 114 for the mesa of each VCSEL element 112. This may be suitable for an array having 17 µm pitch, for example.

As used herein, the terms "substantially" or "generally" refer to the complete or nearly complete extent or degree of an action, characteristic, property, state, enclosed would mean that the object is either completely enclosed or nearly completely enclosed. The exact allowable degree of deviation from absolute completeness may in some cases depend on the specific context. However, generally speaking, the nearness of completion will be so as to have generally the same overall result as if absolute and total completion were obtained. The use of "substantially" or "generally" is equally applicable when used in a negative connotation to refer to the complete or near complete lack of an action, characteristic, property, state, structure, item, or result. For example, an element, combination, embodiment, or composition that is "substantially free of" or "generally free of" an element may still actually contain such element as long as there is generally no significant effect thereof.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

Additionally, as used herein, the phrase "at least one of [X] and [Y]," where X and Y are different components that may be included in an embodiment of the present disclosure, means that the embodiment could include component X without component Y, the embodiment could include the component Y without component X, or the embodiment could include both components X and Y. Similarly, when used with respect to three or more components, such as "at least one of [X], [Y], and [Z]," the phrase means that the embodiment could include any one of the three or more components, any combination or sub-combination of any of the components, or all of the components.

In the foregoing description various embodiments of the present disclosure have been presented for the purpose of illustration and description. They are not intended to be exhaustive or to limit the invention to the precise form disclosed. Obvious modifications or variations are possible in light of the above teachings. The various embodiments were chosen and described to provide the best illustration of the principals of the disclosure and their practical application, and to enable one of ordinary skill in the art to utilize the various embodiments with various modifications as are suited to the particular use contemplated. All such modifications and variations are within the scope of the present disclosure as determined by the appended claims when interpreted in accordance with the breadth they are fairly, legally, and equitably entitled.

What is claimed is:

1. A vertical-cavity surface-emitting laser (VCSEL) device comprising:
   an oxide aperture;
   an etched trench surrounding the oxide aperture, wherein the etched trench electrically isolates the oxide aperture;
   a mesa comprising a first mesa portion surrounding the oxide aperture and a mesa tab having an outer end opposite the first mesa portion, and wherein ohmic metal is provided on the mesa tab, wherein the mesa tab is exclusive to the VCSEL element and extends outwardly in a spoke-like manner from an outer edge of the first mesa portion from a top view facing a top surface of the mesa;
   a nitride via on the mesa tab and extending towards the oxide aperture; and
   a ring of interconnect metal.

2. The VCSEL device of claim 1, wherein the mesa comprises two mesa tabs.

3. The VCSEL device of claim 2, wherein the two mesa tabs are diametrically opposed from one another.

4. The VCSEL device of claim 1, wherein the ohmic metal extends over a portion of the mesa tab and a portion of the first mesa portion.

5. The VCSEL device of claim 1, wherein the ohmic metal is provided only on the mesa tab.

6. The VCSEL device of claim 1, wherein the ohmic metal is provided generally centrally on the mesa tab.

7. The VCSEL device of claim 1, wherein the ohmic metal is provided on the mesa tab and on an outer ring of the first mesa portion.

8. The VCSEL device of claim 1, wherein the mesa comprises four mesa tabs.

9. The VCSEL device of claim 1, wherein the ring of interconnect metal is provided over the mesa with an inner border at an inner border of the nitride via.

10. The VCSEL device of claim 1,
    wherein the etched surrounds the first mesa portion at an oxidation distance, wherein the mesa tab extends beyond the oxidation distance.

11. The VCSEL device of claim 10, wherein the ring of interconnect metal is provided over the mesa with an inner border of the interconnect metal being even with an inner border of the nitride via, the ring interconnect metal extending outwardly beyond the oxidation distance.

12. The VCSEL device of claim 1, wherein the device does not include an isolation implant.

13. A vertical-cavity surface-emitting laser (VCSEL) array comprising:
    a plurality of VCSEL elements, each VCSEL element comprising:
    an oxide aperture;

an etched trench surrounding the oxide aperture, wherein the etched trench electrically isolates the oxide aperture without using an isolation implant;

a mesa comprising a first mesa portion and a mesa tab, the mesa tab extending outwardly in a spoke-like manner from an outer edge of the first mesa portion from a top view facing a top surface of the mesa, wherein ohmic metal is provided on the mesa tab; and a nitride via, wherein the nitride via is positioned entirely on the mesa.

* * * * *